United States Patent
Itakura et al.

(10) Patent No.: US 6,642,813 B1
(45) Date of Patent: Nov. 4, 2003

(54) SURFACE ACOUSTIC WAVE DEVICE UTILIZING A ZNO LAYER AND A DIAMOND LAYER

(75) Inventors: Katsuhiro Itakura, Itami (JP); Akihiro Hachigo, Itami (JP); Satoshi Fujii, Itami (JP); Hideaki Nakahata, Itami (JP); Shinichi Shikata, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 44 days.

(21) Appl. No.: 10/089,816

(22) PCT Filed: Oct. 11, 2000

(86) PCT No.: PCT/JP00/07057
§ 371 (c)(1),
(2), (4) Date: Apr. 4, 2002

(87) PCT Pub. No.: WO01/28090
PCT Pub. Date: Apr. 19, 2001

(30) Foreign Application Priority Data

Oct. 15, 1999 (JP) ............................................. 11-293621

(51) Int. Cl.⁷ ............................. H03H 9/64; H03H 9/25; H03H 9/145
(52) U.S. Cl. ................ 333/193; 310/313 A; 310/313 B; 333/150
(58) Field of Search ................................. 333/193–196, 333/150–155; 310/313 R, 313 A, 313 B, 313 C, 313 D

(56) References Cited

U.S. PATENT DOCUMENTS

| | | | |
|---|---|---|---|
| 5,160,869 A | | 11/1992 | Nakahata et al. ........ 310/313 A |
| 5,294,858 A | * | 3/1994 | Nakahata et al. ........ 310/313 A |
| 5,329,208 A | * | 7/1994 | Imai et al. ............... 310/313 R |
| 5,426,340 A | * | 6/1995 | Higaki et al. ........... 310/313 R |
| 5,440,189 A | * | 8/1995 | Nakahata et al. ........ 310/313 R |
| 5,446,329 A | | 8/1995 | Nakahata et al. ........ 310/313 A |
| 5,814,918 A | * | 9/1998 | Nakahata et al. ........ 310/313 R |
| 5,888,646 A | * | 3/1999 | Takahashi et al. ........... 428/336 |
| 6,051,063 A | * | 4/2000 | Tanabe et al. ................ 117/89 |
| 6,127,768 A | * | 10/2000 | Stoner et al. ........... 310/313 A |
| 6,469,416 B1 | * | 10/2002 | Itakura et al. .......... 310/313 A |

FOREIGN PATENT DOCUMENTS

| | | |
|---|---|---|
| JP | 64-62911 | 3/1989 |
| JP | 5-83078 | 4/1993 |
| JP | 6-232677 | 8/1994 |
| JP | 9-51248 | 2/1997 |

OTHER PUBLICATIONS

"Kouchoha wo mochiita 10 GHz Diamond SAW Filter", Shinichi Shikada et al., Dai 13 kai Diamond Synposium Kouen Youshishuu, Nov. 25, 1999, pp. 150–151.

"10GHz Narrow Band SAW Filters using Diamond", Akihiro Hachigo et al., 1999 IEEE Ultrasonics Symposium, vol. 1 (received on Jul. 25, 2000), pp. 325–328.

(List continued on next page.)

Primary Examiner—Barbara Summons
(74) Attorney, Agent, or Firm—McDermott, Will & Emery

(57) ABSTRACT

A surface acoustic wave (SAW) device that is made with diamond, that has high efficiency, and that can be operated at high frequencies, particularly from 9.5 to 10.5 GHz. The SAW device comprises a diamond layer formed singly or formed on a substrate, a ZnO piezoelectric layer, interdigital transducers (IDTs), and a short-circuiting electrode as required. The SAW device has a structure in which the thickness of the ZnO layer, the wavelength of a harmonic of the SAW, and the line width of the IDTs fall in a specified range. With this structure, a large electromechanical coupling coefficient is obtained in a high-frequency range of 10 GHz band by utilizing the third or fifth harmonic of the SAW.

8 Claims, 14 Drawing Sheets

"Development of a Gigahertz SAW Filter Using CVD Diamond Thin Film (No. 2)", Hideki Nakahata et al., Sumitomo Electric Technical Review, No. 41, Jan. 1996, pp. 61–66.

"1.5GHz SAW Bandpass Filter Using Poly–Crystalline Diamond", S. Shikata et al., Itami Research Laboratories, Sumitomo Electric Industries, Ltd., 1993 Ultrasonics Symposium, 1993 IEEE, pp. 277–280.

"High Frequency Surface Acoustic Wave Filter Using ZnO/Diamond/Si Structure", H. Nakahata et al., Itami Research Laboratories, Sumitomo Electric Industries, Ltd., 1992 Ultrasonics Symposium, 1992 IEEE, pp. 377–380.

"SAW Devices on Diamond", H. Nakahata, Itami Research Laboratories, Sumitomo Electric Industries, Ltd., 1995 IEEE Ultrasonics Symposium, 1995 IEEE, pp. 361–370.

"High Frequency Surface Acoustic Wave Filter Using ZnO/Diamond/Si Structure", Hideaki Nakahata et al., Jpn. J. Appl. Phys. vol. 33 (1994) pp. 324–328, Part 1, No. 1A, Jan. 1994, pp. 324–328.

* cited by examiner

SURFACE ACOUSTIC WAVE DEVICE UTILIZING A ZNO LAYER AND A DIAMOND LAYER

FIELD OF THE INVENTION

The present invention relates to a surface acoustic wave (SAW) device that is operated at a frequency band of 10 GHz, that can be produced with a mass-producible line width of 0.5 μm or more in its interdigital transducers (IDTs), and that has excellent operational performance.

DESCRIPTION OF THE BACKGROUND ART

SAW devices rely on a SAW that propagates with its energy concentrated at the surface of a solid. Being small, easy to produce, and stable in temperature properties, they are used in applications such as filters for TV receivers. Generally, SAW devices are provided with IDTs on a piezoelectric body. A typical SAW device has a pair of IDTs on a piezoelectric body to utilize SAWs. AC power fed into the input IDT is converted into mechanical energy at the surface of the piezoelectric body. Since the IDT has a comb-like shape, dense portions and coarse portions are produced in the piezoelectric body, resulting in an acoustic wave. The acoustic wave propagates along the surface of the piezoelectric body to reach the output IDT. Then, the SAW is converted again into electrical energy by the output IDT to be used as the output.

The types of piezoelectric materials used for the above purpose include bulk single crystals, such as $LiNbO_3$ and $LiTaO_3$, and a thin ZnO film that is vapor-grown on a substrate. Commonly used types of materials at the present include a single-crystalline piezoelectric body, a ZnO piezoelectric body grown on glass, and a ZnO piezoelectric body grown on sapphire. An increase in the amount of information transmission in recent years has caused the transmission signal to extend into the microwave range, so there is a growing demand for devices that can be used in the 10-GHz band.

Generally, the operation frequency of a SAW device is determined by the propagation velocity and wavelength of the SAW. The wavelength is determined by the distance across one cycle of the lines of the IDT. When an IDT having the same distance across one cycle of the lines is used, i.e., when the same wavelength is used for operating a SAW device, the SAW device having a higher wave propagation velocity in the piezoelectric material can be used at a higher frequency.

The single-crystalline piezoelectric body $LiNbO_3$ yields a propagation velocity, V, of 3,500 to 4,000 m/s, and $LiTaO_3$, of 3,300 to 3,400 m/s. A ZnO piezoelectric crystal grown on a glass substrate yields about 3,000 m/s at maximum. The conventional materials having such a low velocity cannot be used in the 10-GHz band unless the line width is decreased to less than 0.5 μm. To solve this problem, a method in which diamond, which has the highest sound velocity among the materials (transversal wave velocity: 13,000 m/s, longitudinal wave velocity: 16,000 m/s), is used as a substrate has been devised (see, for example, published Japanese patent application Tokukaishou 64-62911).

However, even though a propagation velocity of 10,000 m/s is achieved by the use of diamond, it is necessary to provide by fine processing IDTs having a line width of 0.25 μm (the line width is equal to a quarter of the wavelength) to produce a SAW device that operates in the vicinity of a central frequency of 10 GHz. Such IDTs cannot be mass-produced under the current conditions of the process technology. Generally, a SAW device operates with higher efficiency when it has a larger electromechanical coupling coefficient. Here, the coefficient represents a measure of the conversion efficiency when electrical energy is converted into mechanical energy. In particular, it is desirable that the electromechanical coupling coefficient be 0.5% or more.

In the case of a thin piezoelectric film formed on a substrate, the propagation velocity and electromechanical coupling coefficient depend not only on the materials of the piezoelectric film and substrate but also on the thickness of the piezoelectric film and the line width of the IDTs. It is necessary to utilize a harmonic of a SAW for producing a SAW device that operates in the vicinity of 10 GHz with a mass-producible line width of 0.5 μm or more. An object of the present invention is to offer a SAW device that operates in the vicinity of 10 GHz with high efficiency. The present invention achieves this object by utilizing a harmonic of a SAW that allows the IDTs to be provided with a mass-producible line width of 0.5 μm or more.

DETAILED DESCRIPTION OF THE INVENTION

In the present invention, the thickness of a ZnO film is expressed in the following formula:

$$(2\pi \cdot H/\lambda_M),$$

where H: the actual thickness of the ZnO film; and
$\lambda_M$: the wavelength of a harmonic of a SAW that propagates along the film.

Similarly, the thickness of a diamond substrate is expressed in the following formula:

$$(2\pi \cdot HD/\lambda_M),$$

where HD: the actual thickness of the diamond substrate.

These formulas are parameters with no dimension.

Experiments carried out by the present inventors reveal that the film thicknesses H and HD affect the propagation velocity V and the electromechanical coupling coefficient $K^2$ by the ratios to the wavelength. It is therefore, useful to employ the foregoing parameters in classifying the conditions. FIGS. 1 to 4 show the cross-sectional views of the SAW devices of the present invention. These devices are called simply the I, II, III, and IV types.

SIMPLE EXPLANATION OF THE DRAWINGS

Figure 5:
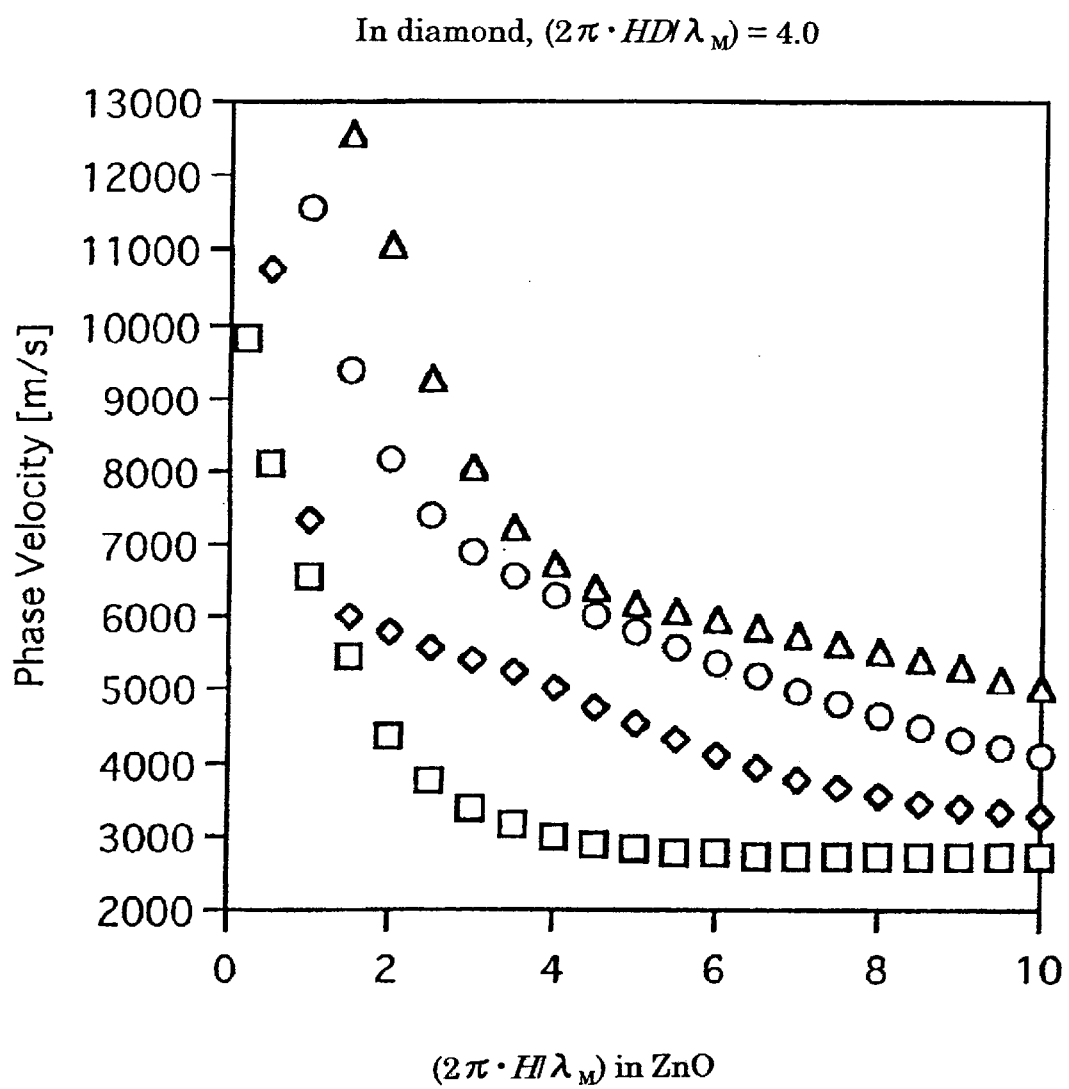
Figure 6:
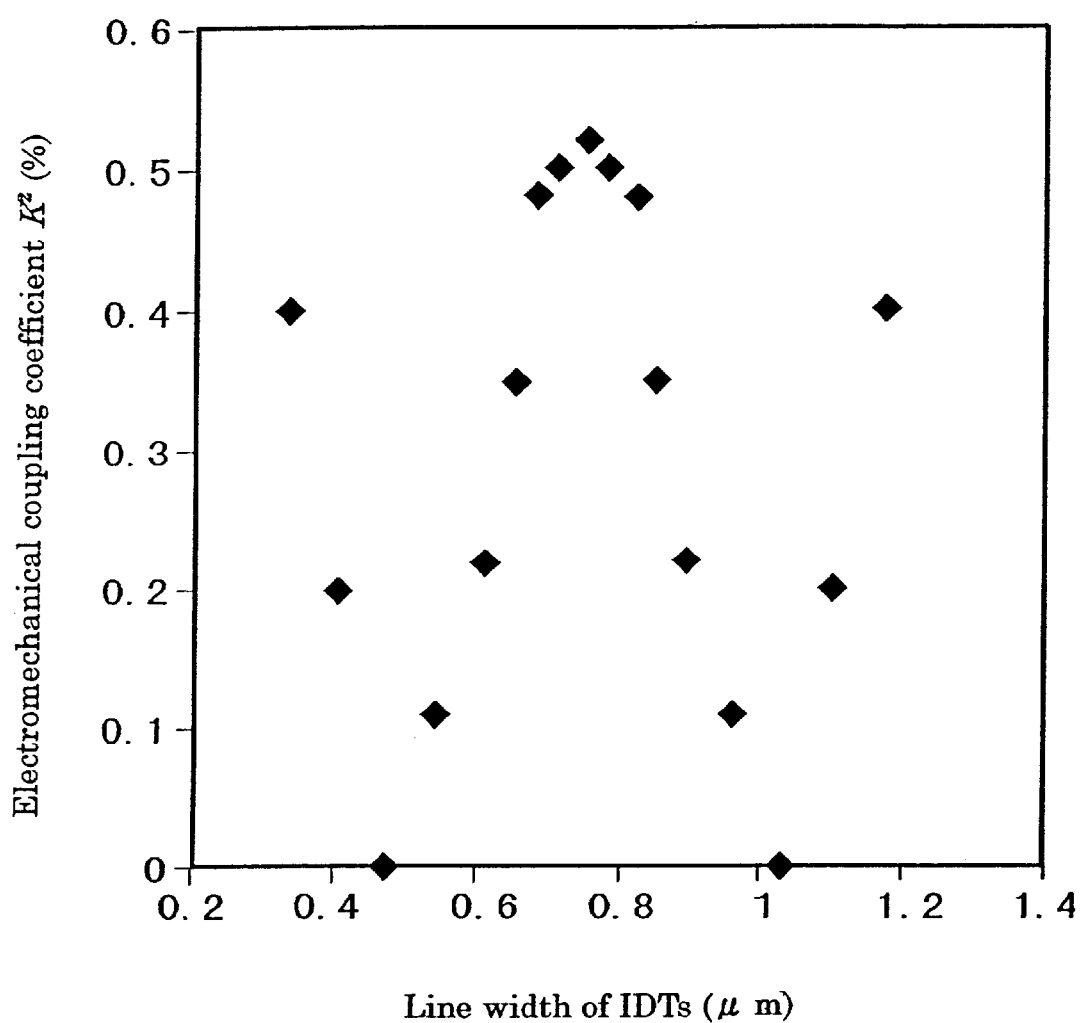
Figure 7:
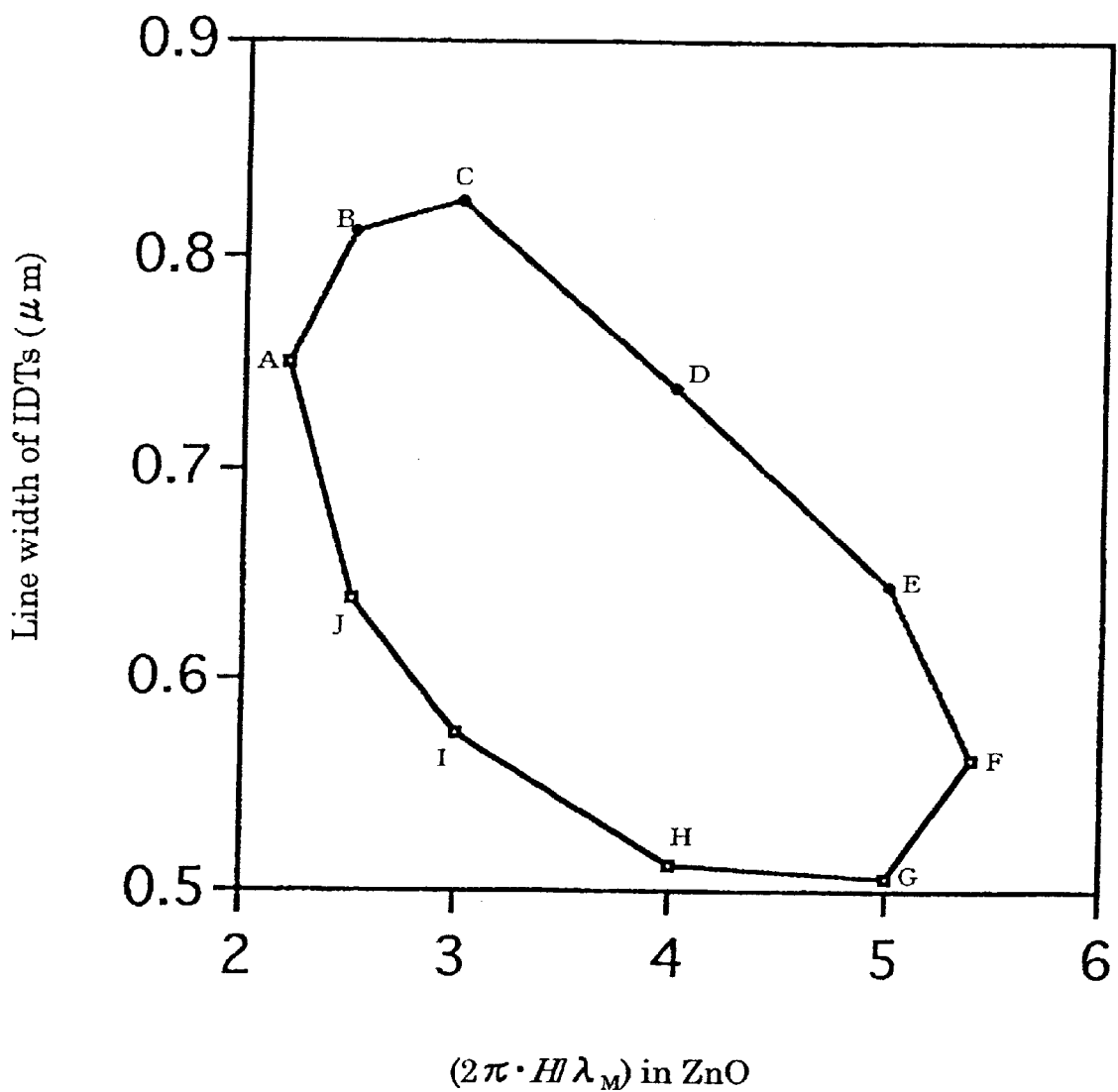
Figure 8:
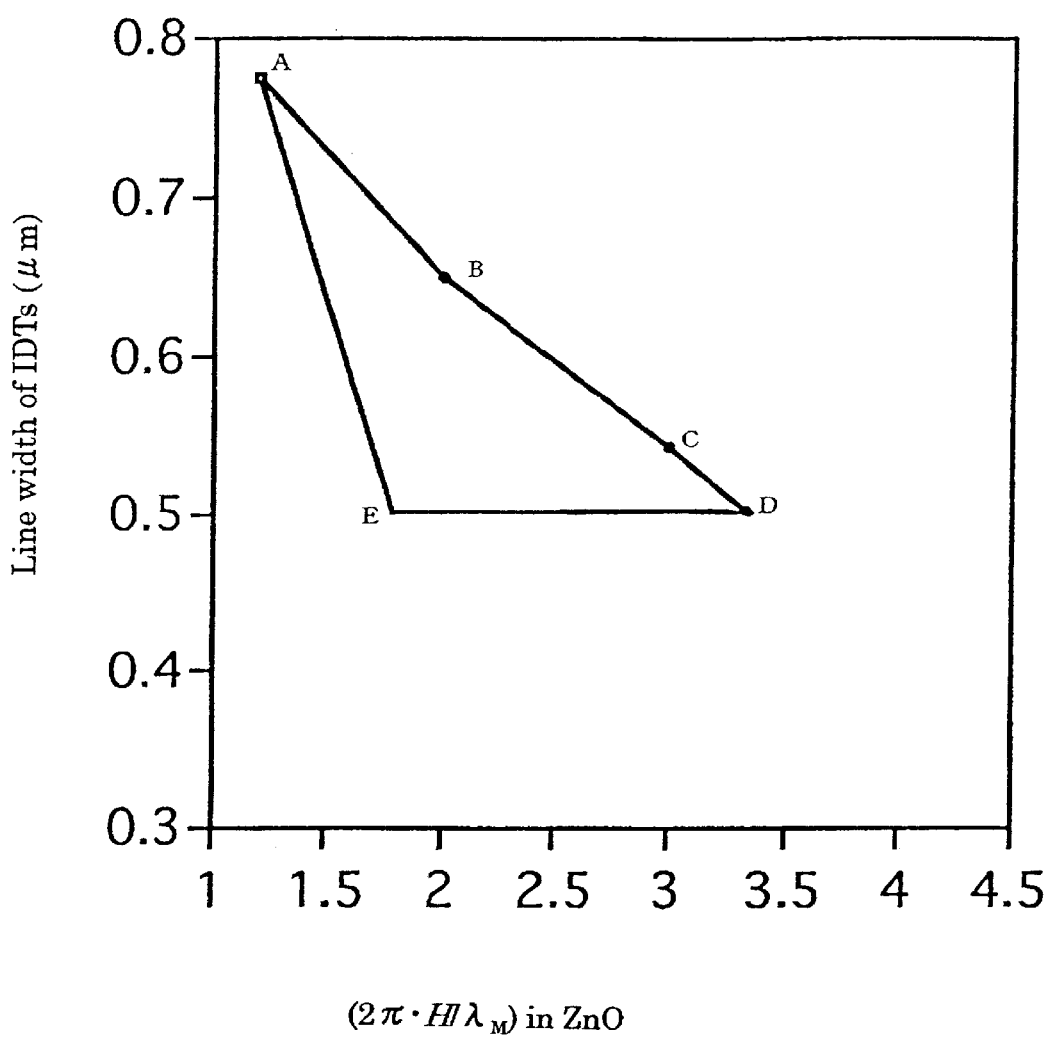
Figure 9:
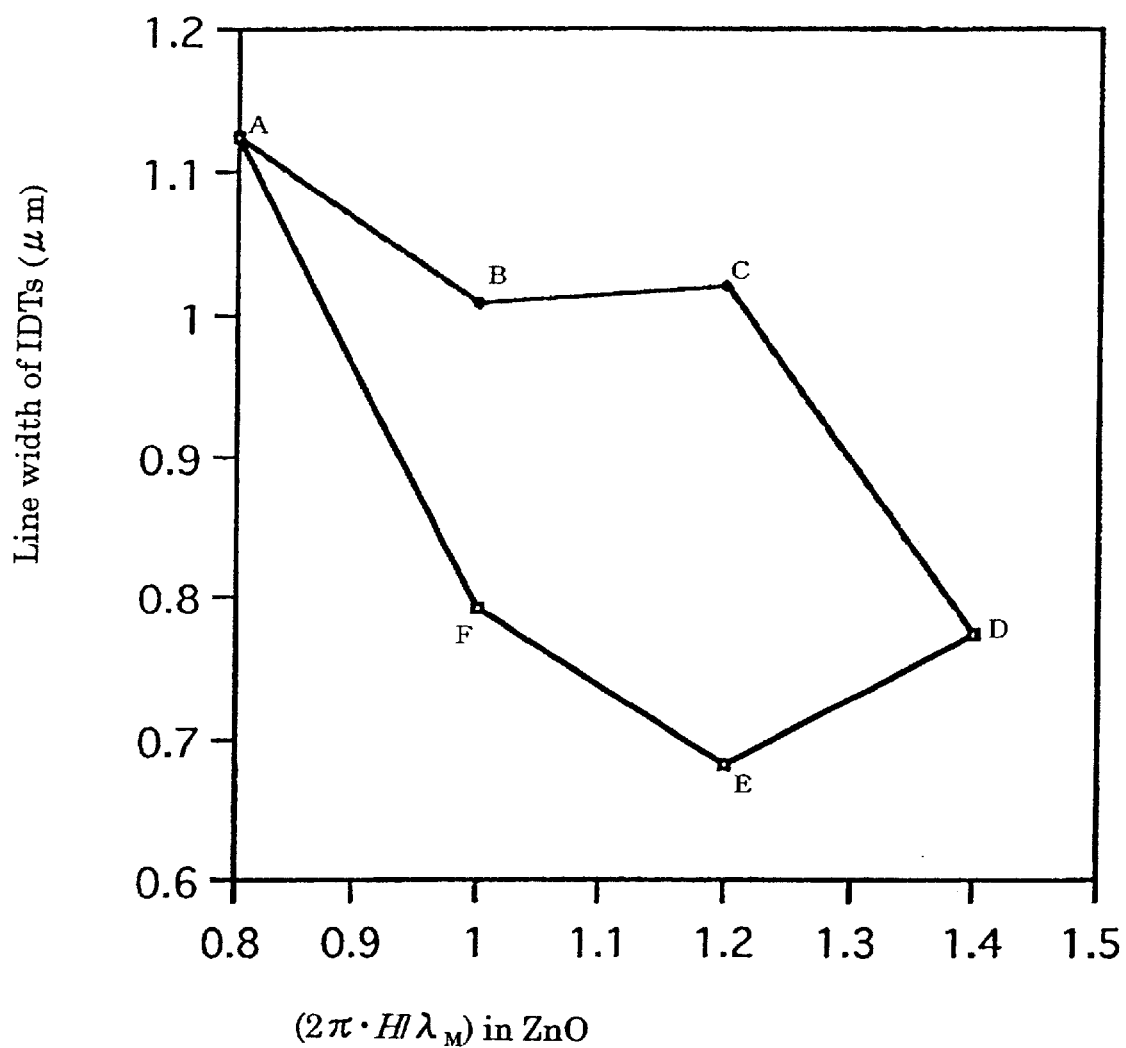
Figure 10:
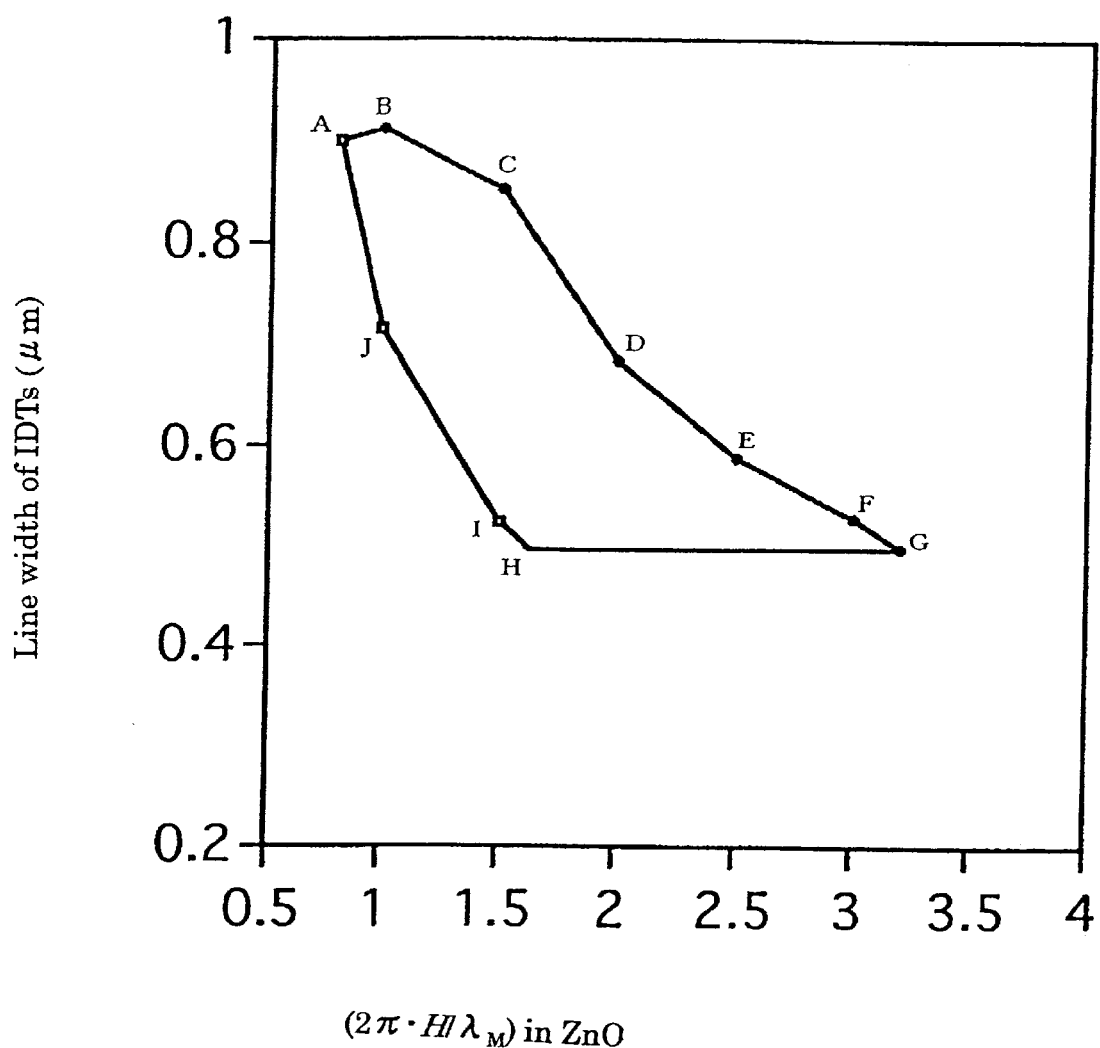
Figure 11:
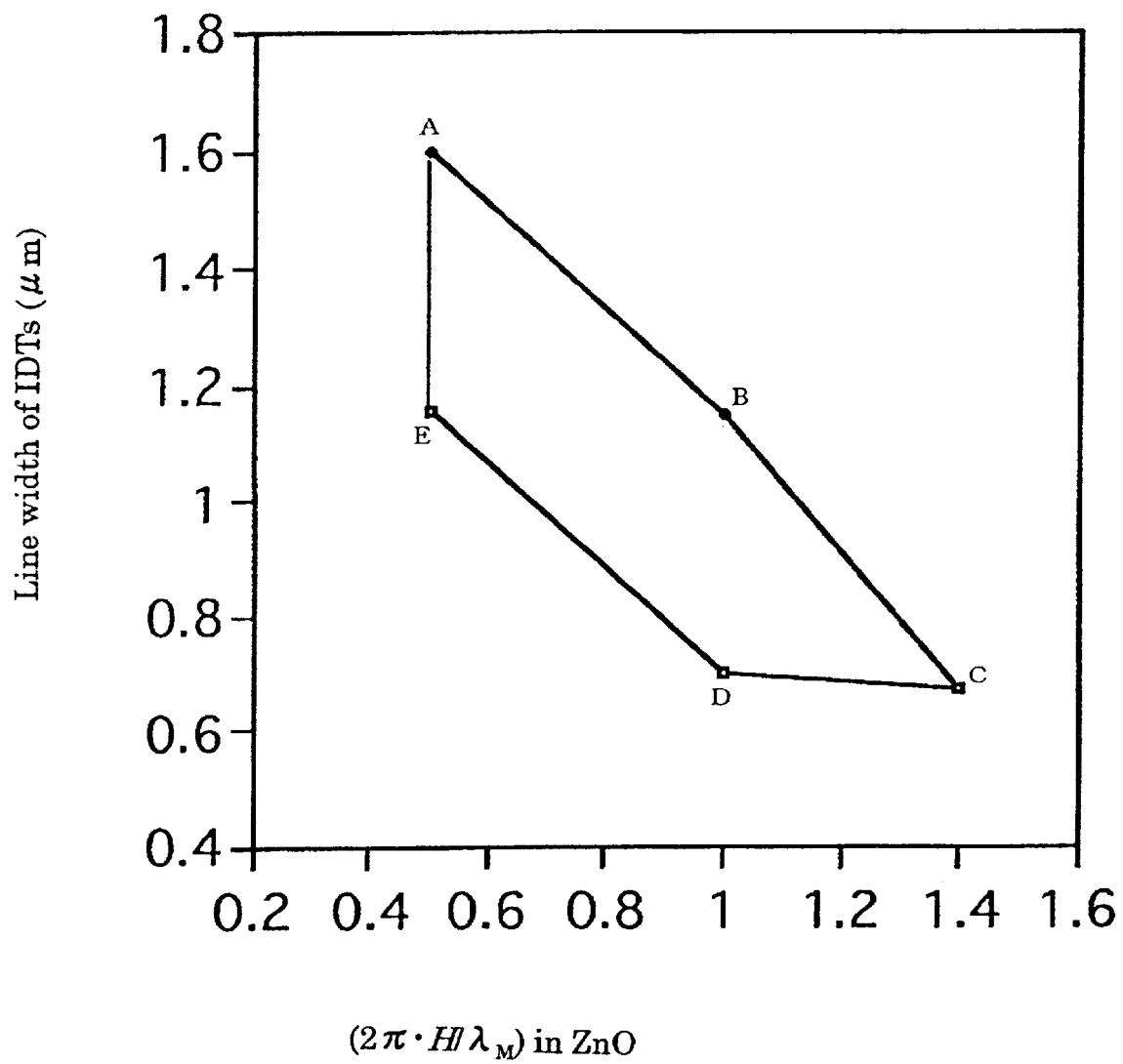
Figure 12:
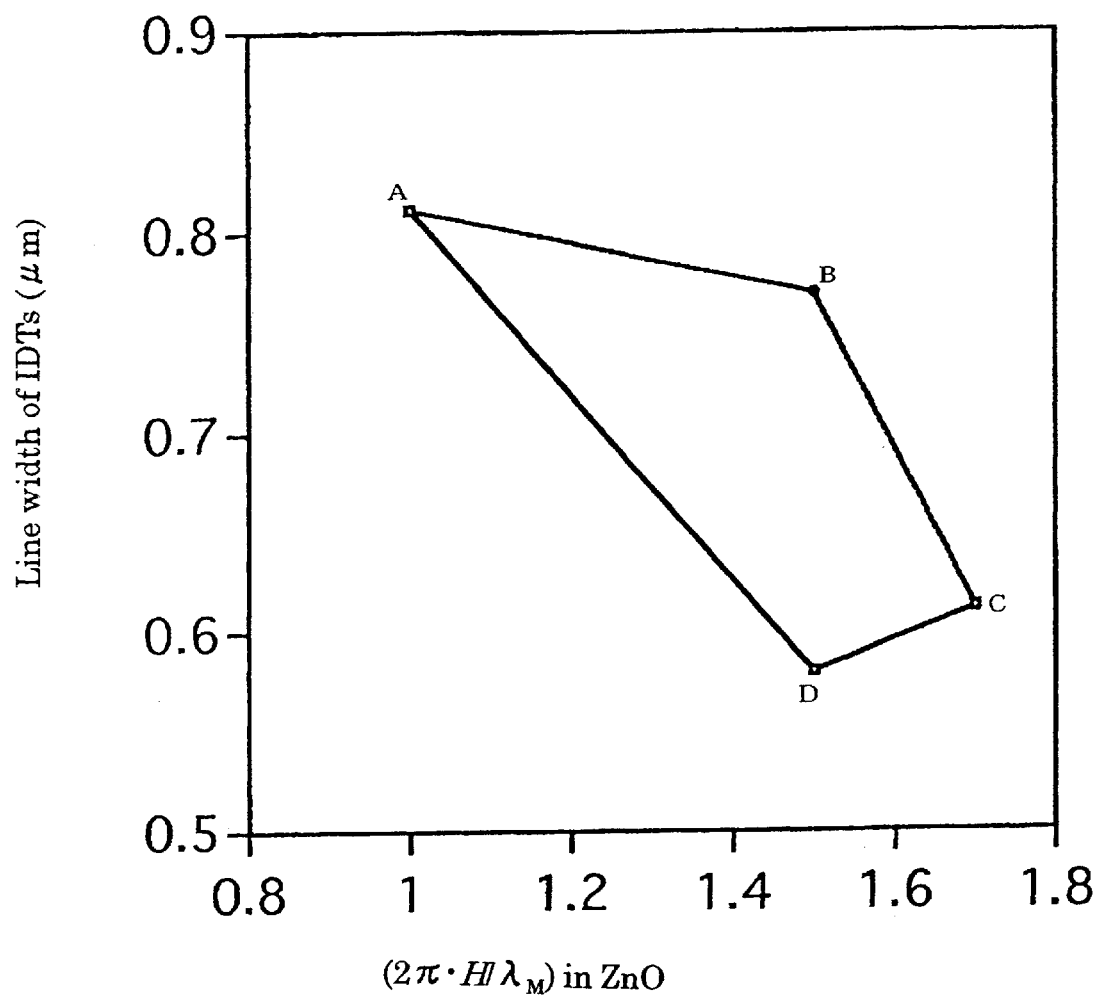
Figure 13:
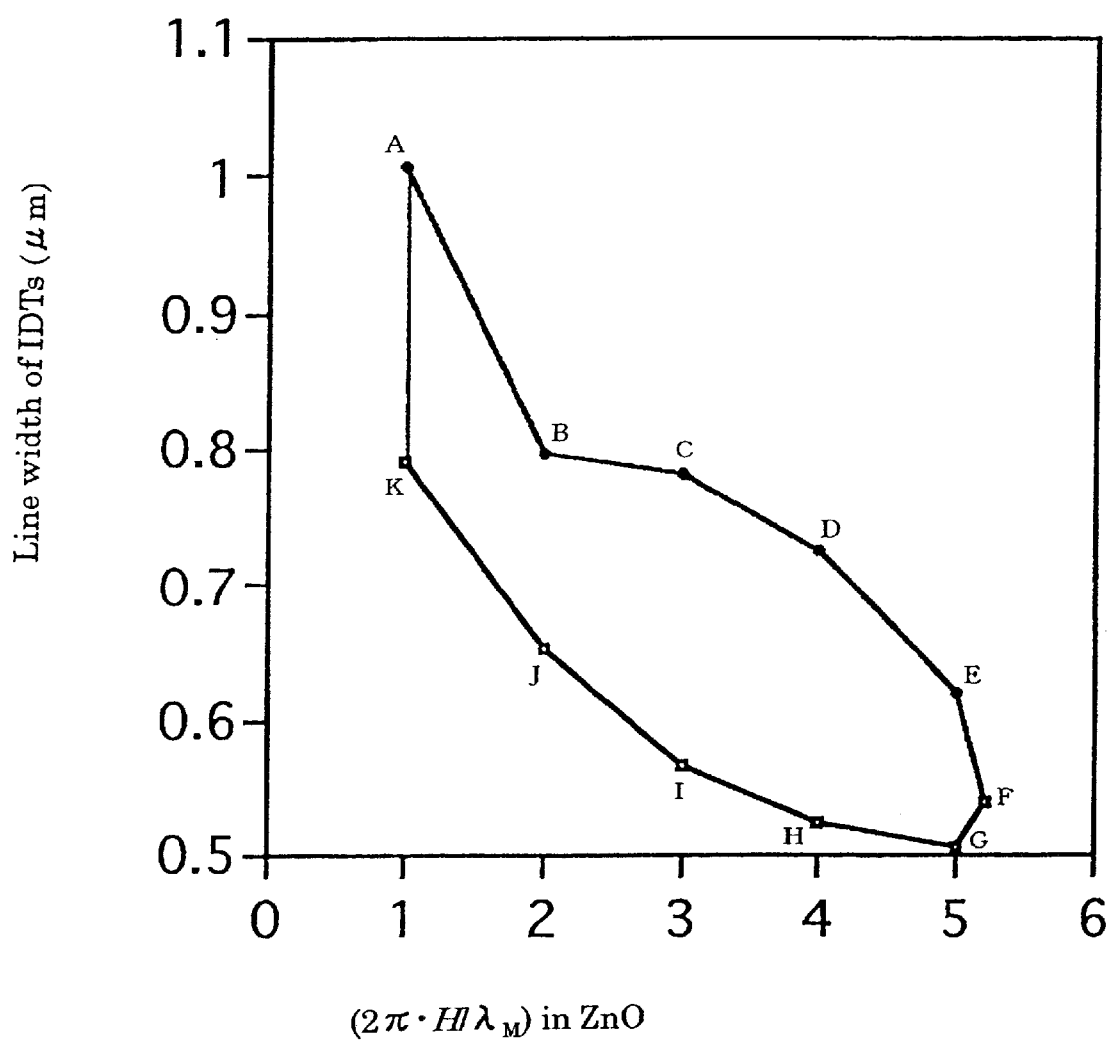
Figure 14:
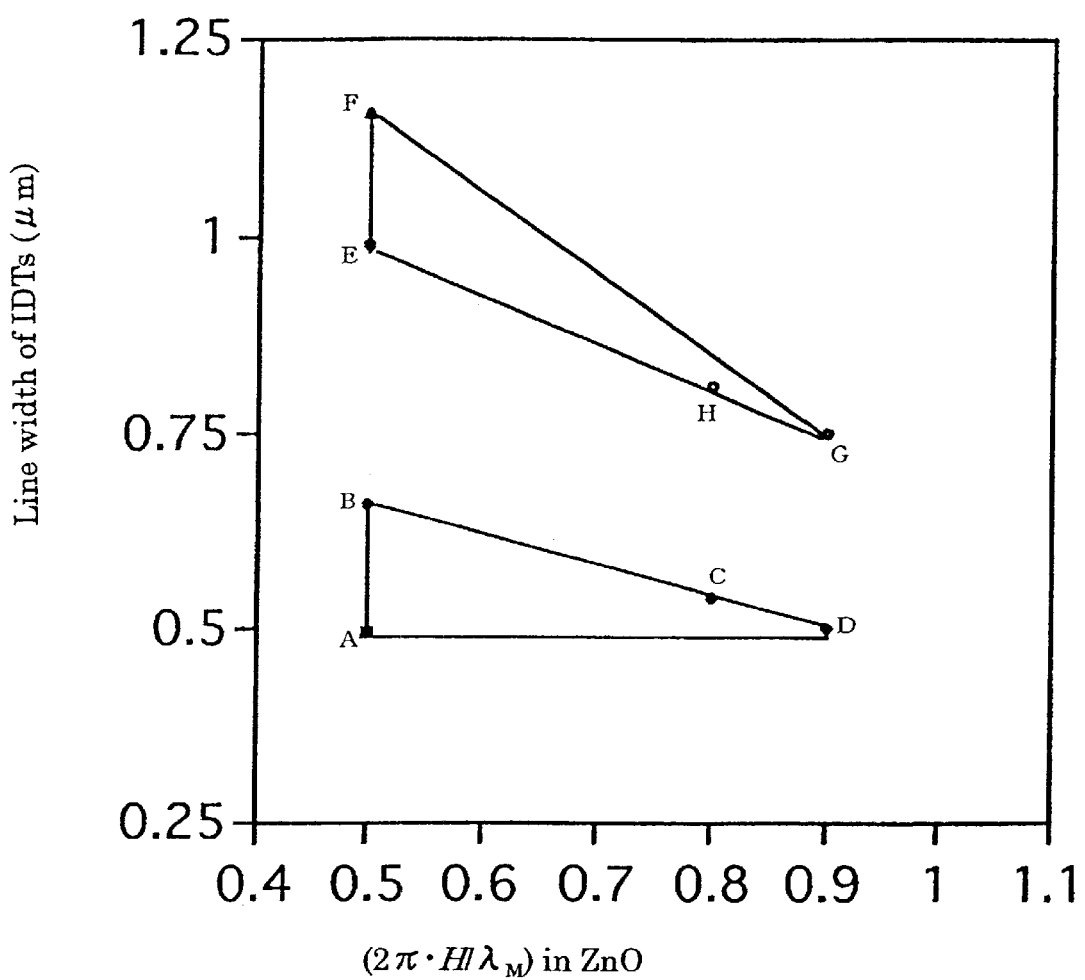
Figure 15:
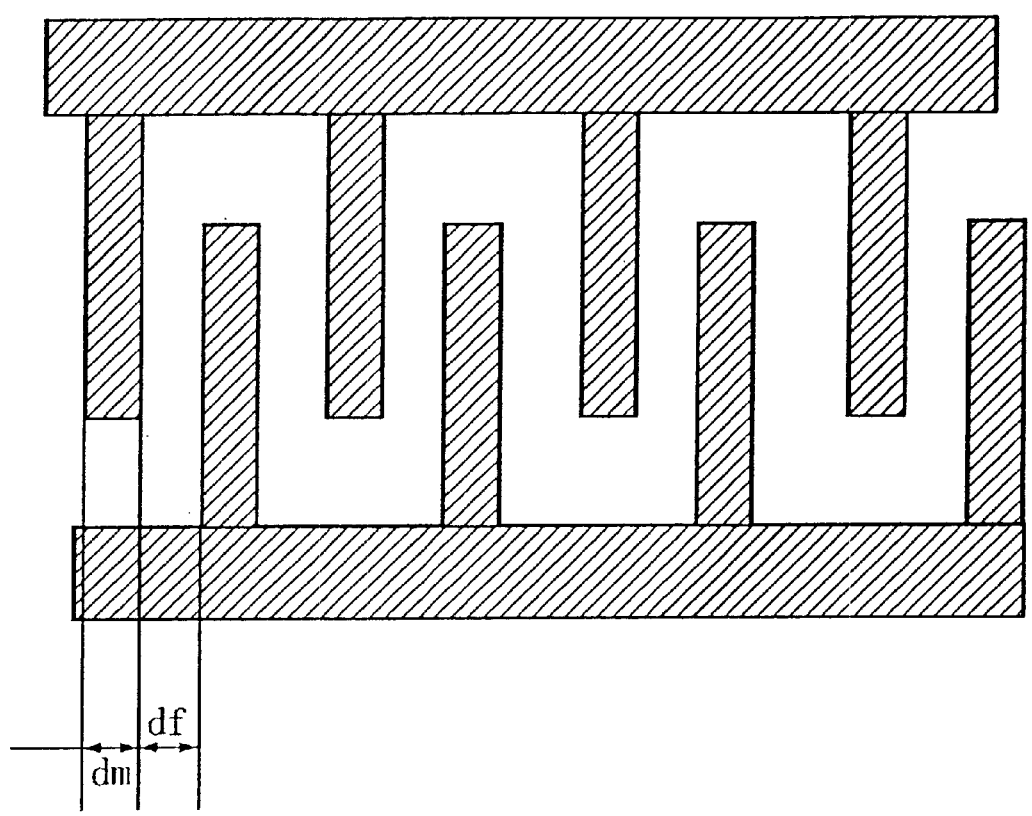
Figure 16:
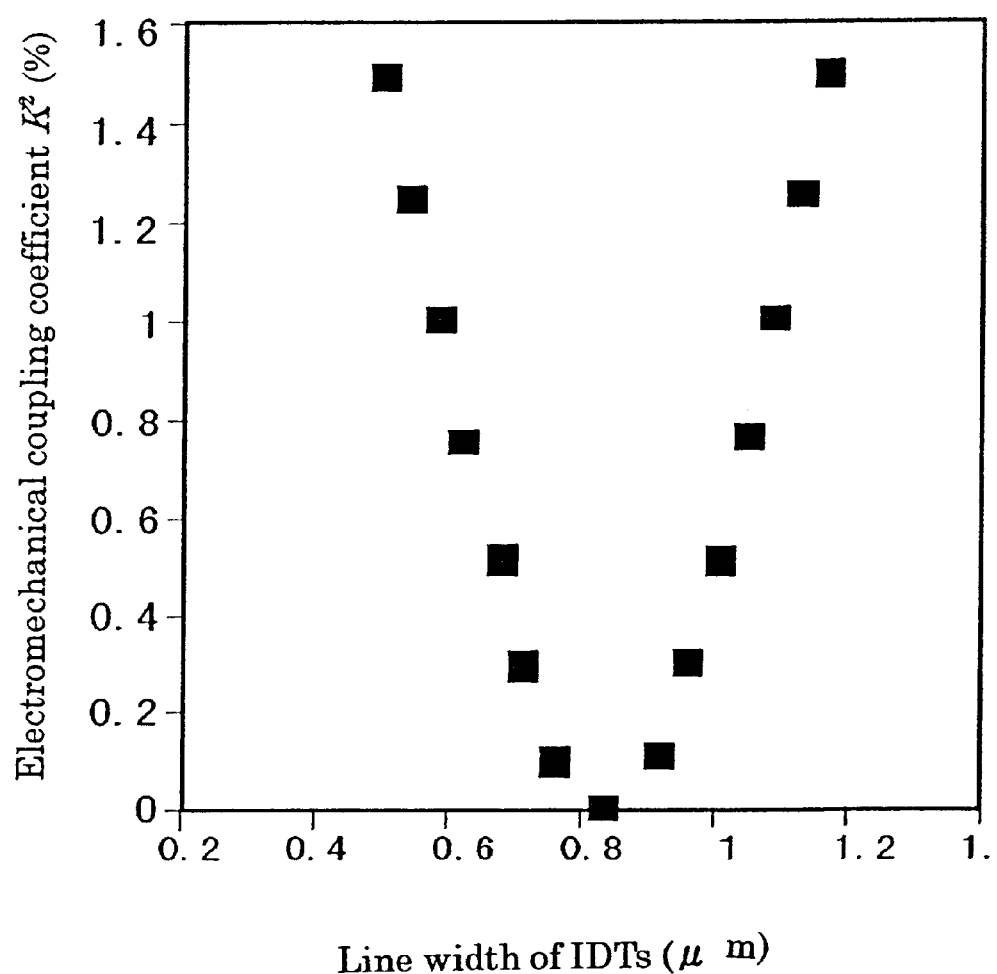

FIG. 5 is a graph showing the measured results of the relationship between the phase velocity V of a SAW and the thickness of the ZnO layer in an example of the present invention when the thickness of the diamond layer is fixed at $(2\pi \cdot HD/\lambda_M)=4.0$, in which graph the squares represent the 0th-order mode of a SAW ; the diamonds, the 1st-order mode; the circles, the 2nd-order mode; and the triangles, the 3rd-order mode;

FIG. 6 is a graph showing the measured results of the relationship between the electromechanical coupling coefficient $K^2$ and the line width of the IDTs at the fifth harmonic in the 1st-order mode of a SAW in the I type SAW device in an example of the present invention;

FIG. 7 is a graph showing range ABCDEFGHIJA in an orthogonal-coordinate system, where the axis of abscissa represents $(2\pi \cdot H/\lambda_M)$ and the axis of ordinate represents the line width dm, when the fifth harmonic in the 1st-order mode of a SAW is utilized for the I type SAW device in an example of the present invention;

FIG. 8 is a graph showing range ABCDEA in an orthogonal-coordinate system, where the axis of abscissa represents $(2\pi \cdot H/\lambda_M)$ and the axis of ordinate represents the line width dm, when the fifth harmonic in the 0th-order mode of a SAW is utilized for the II type SAW device in an example of the present invention;

FIG. 9 is a graph showing range ABCDEFA in an orthogonal-coordinate system, where the axis of abscissa represents $(2\pi \cdot H/\lambda_M)$ and the axis of ordinate represents the line width dm, when the fifth harmonic in the 1st-order mode of a SAW is utilized for the II type SAW device in an example of the present invention;

FIG. 10 is a graph showing range ABCDEFGHIJA in an orthogonal-coordinate system, where the axis of abscissa represents $(2\pi \cdot H/\lambda_M)$ and the axis of ordinate represents the line width dm, when the fifth harmonic in the 0th-order mode of a SAW is utilized for the m type SAW device in an example of the present invention;

FIG. 11 is a graph showing range ABCDEA in an orthogonal-coordinate system, where the axis of abscissa represents $(2\pi \cdot H/\lambda_M)$ and the axis of ordinate represents the line width dm, when the fifth harmonic in the 1st-order mode of a SAW is utilized for the III type SAW device in an example of the present invention;

FIG. 12 is a graph showing range ABCDA in an orthogonal-coordinate system, where the axis of abscissa represents $(2\pi \cdot H/\lambda_M)$ and the axis of ordinate represents the line width dm, when the fifth harmonic in the 0th-order mode of a SAW is utilized for the IV type SAW device in an example of the present invention;

FIG. 13 is a graph showing range ABCDEFGHIJKA in an orthogonal-coordinate system, where the axis of abscissa represents $(2\pi \cdot H/\lambda_M)$ and the axis of ordinate represents the line width dm, when the fifth harmonic in the 1st-order mode of a SAW is utilized for the IV type SAW device in an example of the present invention;

FIG. 14 is a graph showing ranges ABCDA and EFGHE in an orthogonal-coordinate system, where the axis of abscissa represents $(2\pi \cdot H/\lambda_M)$ and the axis of ordinate represents the line width dm, when the third harmonic in the 1st-order mode of a SAW is utilized for the m type SAW device in an example of the present invention;

FIG. 15 is a plan view of the IDT used in the examples of the present invention;

FIG. 16 is a graph showing the measured results of the relationship between the electromechanical coupling coefficient $K^2$ and the line width of the IDTs at the third harmonic in the 1st-order mode of a SAW in the III type SAW device in an example of the present invention;

EXPLANATION OF THE REFERENCED NUMERALS

In FIGS. 1 to 4, "1" represents a substrate; "2", a diamond layer; "3", a ZnO layer; "4", IDTs; and "5", a short-circuiting electrode.

BEST MODE FOR CARRYING OUT THE INVENTION

Figure 1:
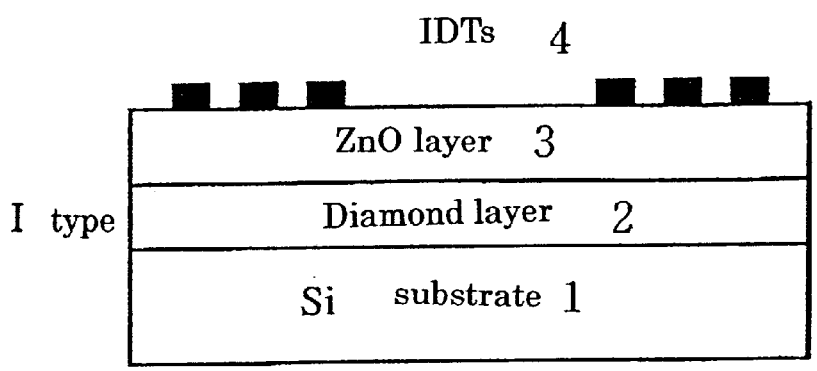
FIG. 1 is a cross-sectional view showing an example of the I type SAW device of the present invention.

FIG. 1 shows the I type SAW device, in which an Si substrate 1 supports a diamond layer 2, a ZnO layer 3, and IDTs 4 each formed in this order.

Figure 2:
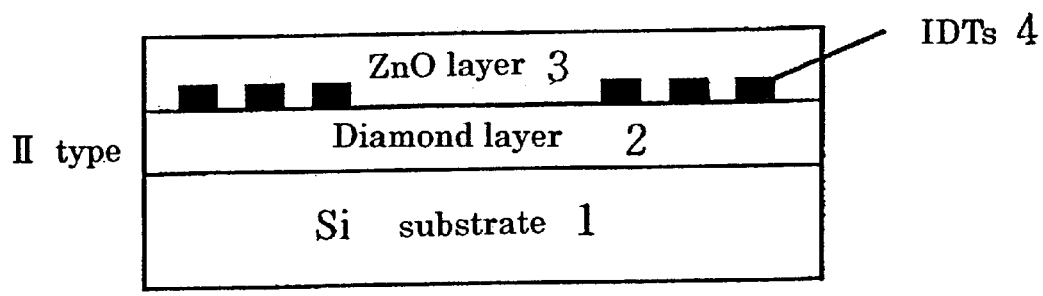
FIG. 2 is a cross-sectional view showing an example of the II type SAW device of the present invention.

FIG. 2 shows the II type SAW device, in which an Si substrate 1 supports a diamond layer 2, IDTs 4, and a ZnO layer 3 each formed in this order.

Figure 3:
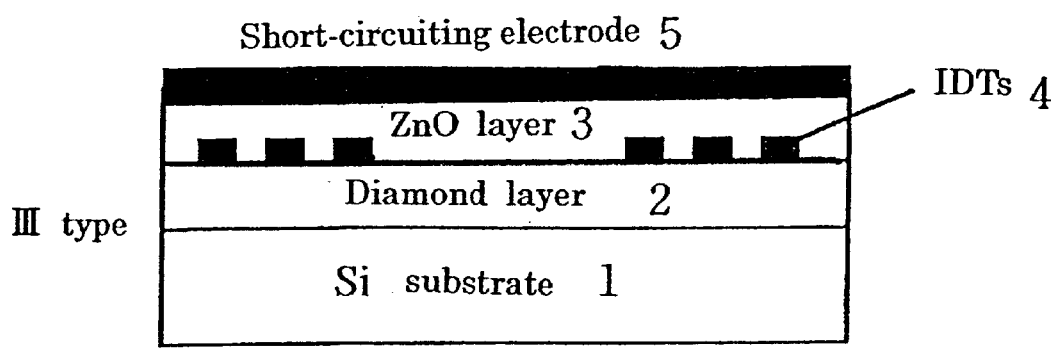
FIG. 3 is a cross-sectional view showing an example of the III type SAW device of the present invention.

FIG. 3 shows the III type SAW device, in which an Si substrate 1 supports a diamond layer 2, IDTs 4, and a ZnO layer 3 each formed in this order. The structure up to this stage is the same as that of the II type. This type, however, has a short-circuiting electrode 5 formed on the ZnO layer 3.

Figure 4:
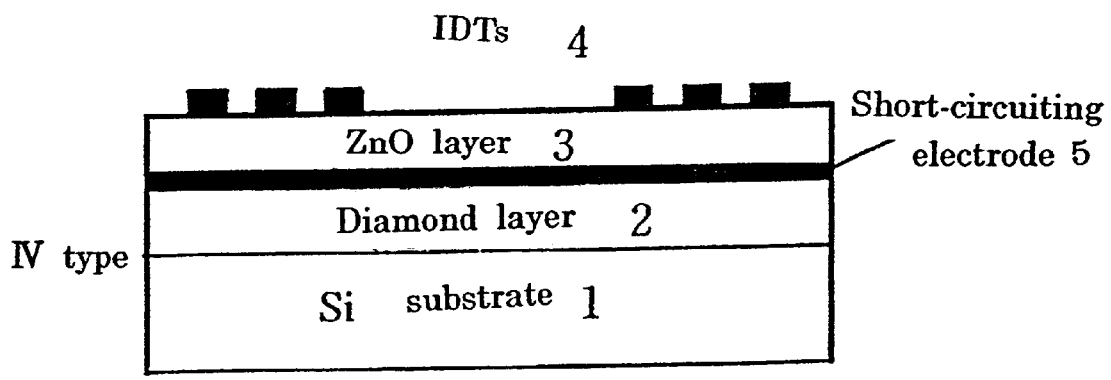
FIG. 4 is a cross-sectional view showing an example of the IV type SAW device of the present invention.

FIG. 4 shows the IV type SAW device, in which an Si substrate 1 supports a diamond layer 2, a short-circuiting electrode 5, a ZnO layer 3, and IDTs 4 each formed in this order.

The present invention is explained below by referring to the experimental results. As mentioned previously, $\lambda_M$ signifies the wavelength of a harmonic of a SAW.

FIG. 5 is a graph showing the measured results of the phase velocity (propagation velocity) in the I type structure when the thickness of the ZnO layer, H, was varied with the thickness of the diamond layer, HD, fixed at $(2\pi \cdot HD/\lambda_M)=4.0$. The axis of abscissa represents $(2\pi \cdot H/\lambda_M)$ and the axis of ordinate represents the phase velocity. The results show that the phase velocity increases with the decreasing thickness of the ZnO layer because of the increase in the effect of diamond, which has high sound velocity. In the figure, the squares represent the 0th-order mode of a SAW; the diamonds, the 1st-order mode; the circles, the 2nd-order mode; and the triangles, the 3rd-order mode.

The wavelength $\lambda_M$ can be obtained from the distance across one cycle of the lines of the IDT as shown in FIG. 15 and is given in the following formula:

$$\lambda_M = 2 \cdot (df+dm)/M,$$

where dm: the line width of the IDTs;
df: the distance between the neighboring lines; and
M: the multiple of a harmonic of a SAW.

The phase velocity does not change with the difference in the structure of the SAW device (there is no difference in the phase velocity between the I, II, III, and IV types).

FIG. 6 is a graph showing the measured results of the relationship between the electromechanical coupling coefficient $K^2$ and the line width of the IDTs at the fifth harmonic in the 1st-order mode of a SAW in the I type structure when the thickness of the ZnO layer was fixed at $(2\pi \cdot H/\lambda_M)=2.2$. When the line width is 0.47 $\mu$m or 1.03 $\mu$m, $K^2$ becomes zero. $K^2$ increases as the line width deviates from these values. The measured results are symmetric with respect to a line of 0.75 $\mu$m width. The measuring frequency was 10 GHz. The same frequency was used for all of the following measurements.

FIG. 7 is a graph showing an operation range of the I type structure in a two-dimensional orthogonal-coordinate system. The I type SAW device has a thin dielectric film made of a diamond layer formed singly or formed on a substrate. IDTs are placed on a ZnO layer which is laminated on the dielectric film to excite a SAW. In FIG. 7, the axis of abscissa represents $(2\pi \cdot H/\lambda_M)$ and the axis of ordinate represents dm, where H signifies the thickness of the ZnO layer, $\lambda_M$ signifies the wavelength of a harmonic of a SAW, and dm signifies the line width of the IDTs. In FIG. 7, range ABCDEFGHIJA is provided by connecting the following 10 points with 10 lengths of lines in this order:

point A given by the coordinates, $(2\pi \cdot H/\lambda_M)=2.2$ and dm=0.750;

point B given by the coordinates, $(2\pi \cdot H/\lambda_M)=2.5$ and dm=0.812;

point C given by the coordinates, $(2\pi \cdot H/\lambda_M)$=3.0 and dm=0.826;

point D given by the coordinates, $(2\pi \cdot H/\lambda_M)$=4.0 and dm=0.738;

point E given by the coordinates, $(2\pi \cdot H/\lambda_M)$=5.0 and dm=0.644;

point F given by the coordinates, $(2\pi \cdot H/\lambda_M)$=5.4 and dm=0.563;

point G given by the coordinates, $(2\pi \cdot H/\lambda_M)$=5.0 and dm=0.506;

point H given by the coordinates, $(2\pi \cdot H/\lambda_M)$=4.0 and dm=0.513;

point I given by the coordinates, $(2\pi \cdot H/\lambda_M)$=3.0 and dm=0.574;

point J given by the coordinates, $(2\pi \cdot H/\lambda_M)$=2.5 and dm=0.638; and point A.

The SAW device has a structure that satisfies the condition that $(2\pi \cdot H/\lambda_M)$ and dm fall in range ABCDEFGHIJA including the surrounding 10 lengths of lines. Utilizing the fifth harmonic in the 1st-order mode of a SAW excited by the IDTs, the SAW device operates at frequencies in the vicinity of 10 GHz with a line width of 0.5 μm or more. The SAW device has a high efficiency; i.e., it has an electromechanical coupling coefficient of 0.5% or more. However, the electromechanical coupling coefficient $K^2$ is less than 0.5% when the SAW device is produced under conditions beyond the foregoing range.

FIG. 8 is a graph showing an operation range of the II type structure in a two-dimensional orthogonal-coordinate system. The II type SAW device has a thin dielectric film made of a diamond layer formed singly or formed on a substrate. A ZnO layer is laminated on SAW-exciting IDTs are placed on the dielectric film. In FIG. 8, the axis of abscissa represents $(2\pi \cdot H/\lambda_M)$ and the axis of ordinate represents dm, where H signifies the thickness of the ZnO layer, $\lambda_M$ signifies the wavelength of a harmonic of a SAW, and dm signifies the line width of the IDTs. In FIG. 8, range ABCDEA is provided by connecting the following five points with five lengths of lines in this order:

point A given by the coordinates, $(2\pi \cdot H/\lambda_M)$=1.2 and dm=0.775;

point B given by the coordinates, $(2\pi \cdot H/\lambda_M)$=2.0 and dm=0.651;

point C given by the coordinates, $(2\pi \cdot H/\lambda_M)$=3.0 and dm=0.543;

point D given by the coordinates, $(2\pi \cdot H/\lambda_M)$=3.4 and dm=0.500;

point E given by the coordinates, $(2\pi \cdot H/\lambda_M)$=1.8 and dm=0.500; and point A.

The SAW device has a structure that satisfies the condition that $(2\pi \cdot H/\lambda_M)$ and dm fall in range ABCDEA including the surrounding five lengths of lines. Utilizing the fifth harmonic in the 0th-order mode of a SAW excited by the IDTs, the SAW device operates at frequencies in the vicinity of 10 GHz with a line width of 0.5 μm or more. The SAW device has a high efficiency; i.e., it has an electromechanical coupling coefficient of 0.5% or more. However, the electromechanical coupling coefficient $K^2$ is less than 0.5% when the SAW device is produced under conditions beyond the foregoing range.

FIG. 9 is a graph showing an operation range of the II type structure in a two-dimensional orthogonal-coordinate system. The II type SAW device has a thin dielectric film made of a diamond layer formed singly or formed on a substrate. A ZnO layer is laminated on SAW-exciting IDTs which are placed on the dielectric film. In FIG. 9, the axis of abscissa represents $(2\pi \cdot H/\lambda_M)$ and the axis of ordinate represents dm, where H signifies the thickness of the ZnO layer, $\lambda_M$ signifies the wavelength of a harmonic of a SAW, and dm signifies the line width of the IDTs. In FIG. 9, range ABCDEFA is provided by connecting the following six points with six lengths of lines in this order:

point A given by the coordinates, $(2\pi \cdot H/\lambda_M)$=0.8 and dm=1.13;

point B given by the coordinates, $(2\pi \cdot H/\lambda_M)$=1.0 and dm=1.01;

point C given by the coordinates, $(2\pi \cdot H/\lambda_M)$=1.2 and dm=1.02;

point D given by the coordinates, $(2\pi \cdot H/\lambda_M)$=1.4 and dm=0.775;

point E given by the coordinates, $(2\pi \cdot H/\lambda_M)$=1.2 and dm=0.68;

point F given by the coordinates, $(2\pi \cdot H/\lambda_M)$=1.0 and dm=0.792; and point A.

The SAW device has a structure that satisfies the condition that $(2\pi \cdot H/\lambda_M)$ and dm fall in range ABCDEFA including the surrounding six lengths of lines. Utilizing the fifth harmonic in the 1st-order mode of a SAW excited by the IDTs, the SAW device operates at frequencies in the vicinity of 10 GHz with a line width of 0.5 μm or more. The SAW device has high efficiency; i.e., it has an electromechanical coupling coefficient of 0.5% or more. However, the electromechanical coupling coefficient $K^2$ is less than 0.5% when the SAW device is produced under conditions beyond the foregoing range.

FIG. 10 is a graph showing an operation range of the III type structure in a two-dimensional orthogonal-coordinate system. The III type SAW device has a thin dielectric film made of a diamond layer formed singly or formed on a substrate. A ZnO layer is laminated on SAW-exciting IDTs which are placed on the dielectric film. A short-circuiting electrode is laminated on the ZnO layer. In FIG. 10, the axis of abscissa represents $(2\pi \cdot H/\lambda_M)$ and the axis of ordinate represents dm, where H signifies the thickness of the ZnO layer, $\lambda_M$ signifies the wavelength of a harmonic of a SAW, and dm signifies the line width of the IDTs. In FIG. 10, range ABCDEFGHIJA is provided by connecting the following 10 points with 10 lengths of lines in this order:

point A given by the coordinates, $(2\pi \cdot H/\lambda_M)$=0.8 and dm=0.900;

point B given by the coordinates, $(2\pi \cdot H/\lambda_M)$=1.0 and dm=0.910;

point C given by the coordinates, $(2\pi \cdot H/\lambda_M)$=1.5 and dm=0.853;

point D given by the coordinates, $(2\pi \cdot H/\lambda_M)$=2.0 and dm=0.682;

point E given by the coordinates, $(2\pi \cdot H/\lambda_M)$=2.5 and dm=0.589;

point F given by the coordinates, $(2\pi \cdot H/\lambda_M)$=3.0 and dm=0.527;

point G given by the coordinates, $(2\pi \cdot H/\lambda_M)$=3.2 and dm=0.500;

point H given by the coordinates, $(2\pi \cdot H/\lambda_M)$=1.6 and dm=0.500;

point I given by the coordinates, $(2\pi \cdot H/\lambda_M)$=1.5 and dm=0.523;

point J given by the coordinates, $(2\pi\cdot H/\lambda_M)$=1.0 and dm=0.715; and point A.

The SAW device has a structure that satisfies the condition that $(2\pi\cdot H/\lambda_M)$ and dm fall in range ABCDEFGHIJA including the surrounding 10 lengths of lines. Utilizing the fifth harmonic in the 0th-order mode of a SAW excited by the IDTs, the SAW device operates at frequencies in the vicinity of 10 GHz with a line width of 0.5 μm or more. The SAW device has high efficiency; i.e., it has an electromechanical coupling coefficient of 0.5% or more. However, the electromechanical coupling coefficient $K^2$ is less than 0.5% when the SAW device is produced under conditions beyond the foregoing range.

FIG. 11 is a graph showing an operation range of the III type structure in a two-dimensional orthogonal-coordinate system. The III type SAW device has a thin dielectric film made of a diamond layer formed singly or formed on a substrate. A ZnO layer is laminated on SAW-exciting IDTs which are placed on the dielectric film. A short-circuiting electrode is laminated on the ZnO layer. In FIG. 11, the axis of abscissa represents $(2\pi\cdot H/\lambda_M)$ and the axis of ordinate represents dm, where H signifies the thickness of the ZnO layer, $\lambda_M$ signifies the wavelength of a harmonic of a SAW, and dm signifies the line width of the IDTs. In FIG. 11, range ABCDEA is provided by connecting the following five points with five lengths of lines in this order:

point A given by the coordinates, $(2\pi\cdot H/\lambda_M)$=0.5 and dm=1.60;

point B given by the coordinates, $(2\pi\cdot H/\lambda_M)$=1.0 and dm=1.15;

point C given by the coordinates, $(2\pi\cdot H/\lambda_M)$=1.4 and dm=0.675;

point D given by the coordinates, $(2\pi\cdot H/\lambda_M)$=1.0 and dm=0.703;

point E given by the coordinates, $(2\pi\cdot H/\lambda_M)$=0.5 and dm=1.16;

point A.

The SAW device has a structure that satisfies the condition that $(2\pi\cdot H/\lambda_M)$ and dm fall in range ABCDEA including the surrounding five lengths of lines. Utilizing the fifth harmonic in the 1st-order mode of a SAW excited by the IDTs, the SAW device operates at frequencies in the vicinity of 10 GHz with a line width of 0.5 μm or more. The SAW device has high efficiency; i.e., it has an electromechanical coupling coefficient of 0.5% or more. However, the electromechanical coupling coefficient $K^2$ is less than 0.5% when the SAW device is produced under conditions beyond the foregoing range.

FIG. 12 is a graph showing an operation range of the IV type structure in a two-dimensional orthogonal-coordinate system. The IV type SAW device has a thin dielectric film made of a diamond layer formed singly or formed on a substrate. A ZnO layer is laminated on a short-circuiting electrode which is laminated on the dielectric film. SAW-exciting IDTs are placed on the ZnO layer. In FIG. 12, the axis of abscissa represents $(2\pi\cdot H/\lambda_M)$ and the axis of ordinate represents dm, where H signifies the thickness of the ZnO layer, $\lambda_M$ signifies the wavelength of a harmonic of a SAW, and dm signifies the line width of the IDTs. In FIG. 12, range ABCDA is provided by connecting the following four points with four lengths of lines in this order:

point A given by the coordinates, $(2\pi\cdot H/\lambda_M)$=1.0 and dm=0.813;

point B given by the coordinates, $(2\pi\cdot H/\lambda_M)$=1.5 and dm=0.770;

point C given by the coordinates, $(2\pi\cdot H/\lambda_M)$=1.7 and dm=0.613;

point D given by the coordinates, $(2\pi\cdot H/\lambda_M)$=1.5 and dm=0.581; and point A.

The SAW device has a structure that satisfies the condition that $(2\pi\cdot H/\lambda_M)$ and dm fall in range ABCDA including the surrounding four lengths of lines. Utilizing the fifth harmonic in the 0th-order mode of a SAW excited by the IDTs, the SAW device operates at frequencies in the vicinity of 10 GHz with a line width of 0.5 μm or more. The SAW device has high efficiency; i.e., it has an electromechanical coupling coefficient of 0.5% or more. However, the electromechanical coupling coefficient $K^2$ is less than 0.5% when the SAW device is produced under conditions beyond the foregoing range.

FIG. 13 is a graph showing an operation range of the IV type structure in a two-dimensional orthogonal-coordinate system. The IV type SAW device has a thin dielectric film made of a diamond layer formed singly or formed on a substrate. A ZnO layer is laminated on a short-circuiting electrode which is laminated on the dielectric film. SAW-exciting IDTs are placed on the ZnO layer. In FIG. 13, the axis of abscissa represents $(2\pi\cdot H/\lambda_M)$ and the axis of ordinate represents dm, where H signifies the thickness of the ZnO layer, $\lambda_M$ signifies the wavelength of a harmonic of a SAW, and dm signifies the line width of the IDTs. In FIG. 13, range ABCDEFGHIJKA is provided by connecting the following 11 points with 11 lengths of lines in this order:

point A given by the coordinates, $(2\pi\cdot H/\lambda_M)$=1.0 and dm=1.01;

point B given by the coordinates, $(2\pi\cdot H/\lambda_M)$=2.0 and dm=0.798;

point C given by the coordinates, $(2\pi\cdot H/\lambda_M)$=3.0 and dm=0.783;

point D given by the coordinates, $(2\pi\cdot H/\lambda_M)$=4.0 and dm=0.725;

point E given by the coordinates, $(2\pi\cdot H/\lambda_M)$=5.0 and dm=0.619;

point F given by the coordinates, $(2\pi\cdot H/\lambda_M)$=5.2 and dm=0.540;

point G given by the coordinates, $(2\pi\cdot H/\lambda_M)$=5.0 and dm=0.506;

point H given by the coordinates, $(2\pi\cdot H/\lambda_M)$=4.0 and dm=0.525;

point I given by the coordinates, $(2\pi\cdot H/\lambda_M)$=3.0 and dm=0.567;

point J given by the coordinates, $(2\pi\cdot H/\lambda_M)$=2.0 and dm=0.653;

point K given by the coordinates, $(2\pi\cdot H/\lambda_M)$=1.0 and dm=0.792; and point A.

The SAW device has a structure that satisfies the condition that $(2\pi\cdot H/\lambda_M)$ and dm fall in range ABCDEFGHIJKA including the surrounding 11 lengths of lines. Utilizing the fifth harmonic in the 1st-order mode of a SAW excited by the IDTs, the SAW device operates at frequencies in the vicinity of 10 GHz with a line width of 0.5 μm or more. The SAW device has high efficiency; i.e., it has an electromechanical coupling coefficient of 0.5% or more. However, the electromechanical coupling coefficient $K^2$ is less than 0.5% when the SAW device is produced under conditions beyond the foregoing range.

FIG. 16 is a graph showing the measured results of the relationship between the electromechanical coefficient $K^2$ and the line width of the IDTs at the third harmonic in the 1st-order mode of a SAW in the III type structure when the thickness of the ZnO layer was fixed at $(2\pi \cdot H/\lambda_M)=0.5$. When the line width of the IDTs is not more than 0.66 μm or not less than 0.99 μm, $K^2$ becomes 0.5% or more.

FIG. 14 is a graph showing an operation range of the III type structure in a two-dimensional orthogonal-coordinate system. The III type SAW device has a thin dielectric film made of a diamond layer formed singly or formed on a substrate. A ZnO layer is laminated on SAW-exciting IDTs which are placed on the dielectric film. A short-circuiting electrode is laminated on the ZnO layer. In FIG. 14, the axis of abscissa represents $(2\pi \cdot H/\lambda_M)$ and the axis of ordinate represents dm, where H signifies the thickness of the ZnO layer, $\lambda_M$ signifies the wavelength of a harmonic of a SAW, and dm signifies the line width of the IDTs. In FIG. 14, range ABCDA is provided by connecting the following four points with four lengths of lines in this order:

point A given by the coordinates, $(2\pi \cdot H/\lambda_M)=0.50$ and dm=0.50;

point B given by the coordinates, $(2\pi \cdot H/\lambda_M)=0.50$ and dm=0.66;

point C given by the coordinates, $(2\pi \cdot H/\lambda_M)=0.80$ and dm=0.54;

point D given by the coordinates, $(2\pi \cdot H/\lambda_M)=0.90$ and dm=0.50; and point A.

In FIG. 14, range EFGHE is also provided by connecting the following four points with four lengths of lines in this order:

point E given by the coordinates, $(2\pi \cdot H/\lambda_M)=0.50$ and dm=0.99;

point F given by the coordinates, $(2\pi \cdot H/\lambda_M)=0.50$ and dm=1.16;

point G given by the coordinates, $(2\pi \cdot H/\lambda_M)=0.90$ and dm=0.75;

point H given by the coordinates, $(2\pi \cdot H/\lambda_M)=0.80$ and dm=0.81; and point E.

The SAW device has a structure that satisfies the condition that $(2\pi \cdot H/\lambda_M)$ and dm fall in either of range ABCDA including the surrounding four lengths of lines and range EFGHE including the surrounding four lengths of lines. Utilizing the third harmonic in the 1st-order mode of a SAW excited by the IDTs, the SAW device operates at frequencies in the vicinity of 10 GHz with a line width of 0.5 μm or more. The SAW device has high efficiency; i.e., it has an electromechanical coupling coefficient of 0.5% or more. However, the electromechanical coupling coefficient $K^2$ is less than 0.5% when the SAW device is produced under conditions at the outside of the foregoing ranges.

Method for the Embodiment

In the present invention, either natural diamond or synthetic diamond may be used as the diamond layer. They can be a single-crystalline diamond, a polycrystalline diamond, or an amorphous diamond. Furthermore, either a single diamond body or a thin diamond layer formed on a substrate may be used.

The diamond layer may constitute part of a substrate or constitute an entire substrate. The diamond layer may be insulative throughout the layer or may be semiconductive in part or in entirety of the layer. The substrate for forming the diamond layer may be made of an inorganic material, such as Si, Mo, or W, metal, glass, ceramic, oxide, or nitride. An optimum value of $(2\pi \cdot H/\lambda_M)$ is the same for any substrate material. However, when the thickness of the diamond layer is substantially smaller than the wavelength of a SAW, particularly in the case of $(2\pi \cdot HD/\lambda_M)<0.5$, the influence of the substrate material becomes predominant and decreases the propagation velocity of the SAW. It is therefore, desirable that the thickness of the diamond layer satisfy $(2\pi \cdot HD/\lambda_M) \geq 0.5$, and more desirably $(2\pi \cdot HD/\lambda_M) \geq 4.0$.

The diamond layer can be formed by a well-known method such as the CVD, plasma CVD, PVD, or hot-filament method. A gas in a reaction chamber can be converted into plasma by a discharge method such as the high- or low-frequency glow discharge method or the arc discharge method. The diamond layer can be formed by using a compound containing hydrogen atoms. The compound can be combined with a gas that can supply halogen atoms. The types of halogen atom-supplying gases include not only halogen molecules but also halogenated organic compounds, halogenated inorganic compounds, and other compounds that contain halogen atoms in their molecules. These compounds are paraffinic, olefinic, alicyclic, and aromatic organic compounds, such as methane fluoride, ethane fluoride, methane trifluoride, and ethylene fluoride; and inorganic compounds, such as silane halide. The introduction of a halogen gas into a film-forming chamber can reduce the temperature of a substrate, so that the diamond layer can be formed at 200 to 900° C.

It is desirable that a halogen gas have a stronger force of bonding with hydrogen atoms and have a smaller atomic radius. In particular, in order to form a stable film at low pressure, it is desirable to use fluorides. The types of compounds that contain hydrogen atoms include aliphatic hydrocarbons, such as methane, ethane, propane, ethylene, and propylene; aromatic hydrocarbons, such as benzene and naphthalene; organic compounds that have heteroatoms; and other compounds, such as hydrazine.

A highly pure diamond is an insulator having low dielectric constant. However, a semiconductive diamond can be produced by introducing impurities such as B, Al, P, and S or by introducing lattice defects through ion implantation or electron-beam irradiation. Boron-containing semiconductive diamond single crystals not only occur naturally on rare occasion but also can be produced artificially by the super high-pressure method. It is desirable that the diamond layer formed singly or formed on a substrate be an insulator. It is required that its resistivity be $10^7$ Ω·cm or more, desirably $10^9$ Ω·cm or more. It is desirable that the diamond layer formed singly or formed on a substrate have a smooth surface to reduce scattering and other losses of a SAW. It is necessary to polish the surface as the occasion arises. A single-crystalline diamond layer produced by the epitaxial method can also be used.

A ZnO layer having an excellent c-axis orientation property, which produces a considerable piezoelectric property, can be produced by a vapor growth method such as the sputtering method or CVD method. It is desirable that the c-axis orientation property be three degrees or less in a value and that the resistivity be $10^5$ Ω·cm or more. It is desirable that ZnO have a c-axis orientation property. The term "c-axis orientation" is used to mean that the ZnO layer is formed in order for its (001) plane to be in parallel with the substrate. A SAW device can be realized when the formed ZnO layer has a c axis orientation property, that fully exploits the piezoelectric property ZnO innately has.

The IDTs and the short-circuiting electrode are produced with a metal that enables the application of etching for the production process and that has minimal resistivity. The types of the foregoing metal include a metal that can be vapor-deposited at low temperatures, such as Au, Al, and Cu; a metal that is formed into a layer at high temperatures, such as Ti, Mo, and W; and a composite metal that consists of two or more types of metal, such as the one in which Al is vapor-deposited on Ti. In particular, it is desirable to use Al or Ti in terms of the ease of IDT production. The IDTs are formed by the following method: A metal for the IDTs is formed into a layer. A photoresist coating is applied uniformly to the surface of the metal layer. A mask having a pattern of the IDTs on a transparent plate such as a glass plate is placed on the photoresist layer. The photoresist layer is exposed to light from a mercury arc lamp, for example. Electron beams can also be used for forming the IDTs directly. After being exposed, the photoresist is developed to form the IDTs.

It is desirable that the IDTs and the short-circuiting electrode have a thickness of 10 to 500 nm, or so. If less than 10 nm, the electrical resistance increases, increasing the losses. If more than 500 nm, the mass addition effect that causes the reflection of the SAW becomes noticeable. In particular, it is most desirable that the thickness be 10 to 30 nm.

The IDTs made of a low-melting-point metal such as Al can be etched by a wet-etching method that uses an alkaline solution such as a sodium hydroxide solution or that uses an acidic solution such as nitric acid. The IDTs made of a high-melting-point metal can be etched by using a mixed solution of hydrofluoric acid and nitric acid. The IDTs can also be produced by the reactive-ion-etching method using a gas such as $BCl_3$.

The surface of the ZnO layer may be deteriorated by chemicals or gases used for etching the IDTs. To prevent this deterioration, a thin insulator, or a thin dielectric, may be inserted between the ZnO layer and the IDTs. In this case, it is necessary to reduce the thickness of the thin insulator down to 50 nm or less in order to prevent an adverse effect by the thin insulator.

Conditions for Producing Examples of the Present Invention

Four types of SAW filters shown in FIGS. 1 to 4 were produced by changing the thicknesses of the ZnO layer and the diamond layer. The filter characteristics were measured. The phase velocity $V=f \cdot \lambda_M$ of the SAW was obtained from the operating frequency f. The electromechanical coupling coefficient $K^2$ was obtained by the measurement of the radiation impedance of the IDTs. The measuring frequency was 10 GHz.

A diamond layer having a thickness of 50 µm was formed on an Si substrate with a size of 10×10×0.3 mm by using the microwave plasma CVD method. The surface of the diamond was polished with a diamond wheel to obtain various thicknesses from 1 to 30 µm. A polycrystalline diamond was produced by using a gas comprising $CH_4$ diluted 100 times its volume of $H_2$. A single-crystalline diamond was obtained by polishing the (100) plane of an artificial I b type diamond produced by super high-pressure synthesis. All of these layers had a resistivity of $10^9$ Ω·cm or more.

On the polished surface of a diamond layer, a piezoelectric body, IDTs, or a short-circuiting electrode was formed. A ZnO layer was formed as the piezoelectric body. The ZnO layer was obtained by sputtering a ZnO polycrystal with a mixed gas of argon and oxygen. The sputtering was carried out under the conditions of a substrate temperature of 400° C., an RF power of 160 W, and a pressure of 2.7 Pa. The thickness of the ZnO layer was varied from 0.2 to 10 in $(2\pi \cdot H/\lambda_M)$ by adjusting the sputtering time.

The IDTs and the short-circuiting electrode were produced by vapor-depositing Al with the resistance-heating method to a thickness of 50 nm. The line width of the IDTs was adjusted to 0.5 µm or more by using a photolithographic procedure followed by wet etching.

INDUSTRIAL APPLICABILITY

The present invention enables the easy supply of SAW devices that operate at a high-frequency range of 10 GHz band. In the present invention, the utilization of the third and fifth harmonics enables the production of SAW devices having a large electromechanical coupling coefficient with a mass-producible line width of the IDTs. The applications of SAW devices include band-pass filters, resonators, oscillators, and convolvers.

What is claimed is:

1. A surface acoustic wave (SAW) device having SAW-exciting interdigital transducers placed on a ZnO layer laminated on a thin dielectric film made of a diamond layer formed singly or formed on a substrate, the SAW device being characterized by the conditions of:

(a) providing a two-dimensional orthogonal-coordinate system, in which the axis of abscissa is represented by $(2\pi \cdot H/\lambda_M)$ and the axis of ordinate is represented by dm, where H signifies the thickness of the ZnO layer, $\lambda_M$ signifies the wavelength of a harmonic of a SAW, and dm signifies the line width of the interdigital transducers (IDTs);

(b) in the orthogonal-coordinate system, connecting:

point A given by the coordinates, $(2\pi \cdot H/\lambda_M)=2.2$ and dm=0.750;

point B given by the coordinates, $(2\pi \cdot H/\lambda_M)=2.5$ and dm=0.812;

point C given by the coordinates, $(2\pi \cdot H/\lambda_M)=3.0$ and dm=0.826;

point D given by the coordinates, $(2\pi \cdot H/\lambda_M)=4.0$ and dm=0.738;

point E given by the coordinates, $(2\pi \cdot H/\lambda_M)=5.0$ and dm=0.644;

point F given by the coordinates, $(2\pi \cdot H/\lambda_M)=5.4$ and dm=0.563;

point G given by the coordinates, $(2\pi \cdot H/\lambda_M)=5.0$ and dm=0.506;

point H given by the coordinates, $(2\pi \cdot H/\lambda_M)=4.0$ and dm=0.513;

point I given by the coordinates, $(2\pi \cdot H/\lambda_M)=3.0$ and dm=0.574;

point J given by the coordinates, $(2\pi \cdot H/\lambda_M)=2.5$ and dm=0.638; and point A;

in this order to provide a range ABCDEFGHIJA surrounded by 10 lengths of lines;

(c) structuring the SAW device so that $(2\pi \cdot H/\lambda_M)$ and dm can fall within the range ABCDEFGHIJA including the surrounding 10 lengths of lines;

(d) producing the SAW device with the IDTs having a line width of 0.5 µm or more;

(e) utilizing the fifth harmonic in the 1st-order mode of the SAW excited by the IDTs; and (f) operating the SAW device at a frequency not less than 9.5 GHz and not more than 10.5 GHz.

2. A SAW device having a ZnO layer laminated on SAW-exciting IDTs placed on a thin dielectric film made of a diamond layer formed singly or formed on a substrate, the SAW device being characterized by the conditions of:

(a) providing a two-dimensional orthogonal-coordinate system, in which the axis of abscissa is represented by ($2\pi \cdot H/\lambda_M$) and the axis of ordinate is represented by dm, where H signifies the thickness of the ZnO layer, $\lambda_M$ signifies the wavelength of a harmonic of a SAW, and dm signifies the line width of the IDTs;

(b) in the orthogonal-coordinate system, connecting:
point A given by the coordinates, ($2\pi \cdot H/\lambda_M$)=1.2 and dm=0.775;
point B given by the coordinates, ($2\pi \cdot H/\lambda_M$)=2.0 and dm=0.651;
point C given by the coordinates, ($2\pi \cdot H/\lambda_M$)=3.0 and dm=0.543;
point D given by the coordinates, ($2\pi \cdot H/\lambda_M$)=3.4 and dm=0.500;
point E given by the coordinates, ($2\pi \cdot H/\lambda_M$)=1.8 and dm=0.500; and
point A;

in this order to provide a range ABCDEA surrounded by five lengths of lines;

(c) structuring the SAW device so that ($2\pi \cdot H/\lambda_M$) and dm can fall within the range ABCDEA including the surrounding five lengths of lines;

(d) producing the SAW device with the IDTs having a line width of 0.5 µm or more;

(e) utilizing the fifth harmonic in the 0th-order mode of the SAW excited by the IDTs; and (f) operating the SAW device at a frequency not less than 9.5 GHz and not more than 10.5 GHz.

3. A SAW device having a ZnO layer laminated on SAW-exciting IDTs placed on a thin dielectric film made of a diamond layer formed singly or formed on a substrate, the SAW device being characterized by the conditions of:

(a) providing a two-dimensional orthogonal-coordinate system, in which the axis of abscissa is represented by ($2\pi \cdot H/\lambda_M$) and the axis of ordinate is represented by dm, where H signifies the thickness of the ZnO layer, $\lambda_M$ signifies the wavelength of a harmonic of a SAW, and dm signifies the line width of the IDTs;

(b) in the orthogonal-coordinate system, connecting:
point A given by the coordinates, ($2\pi \cdot H/\lambda_M$)=0.8 and dm=1.13;
point B given by the coordinates, ($2\pi \cdot H/\lambda_M$)=1.0 and dm=1.01;
point C given by the coordinates, ($2\pi \cdot H/\lambda_M$)=1.2 and dm=1.02;
point D given by the coordinates, ($2\pi \cdot H/\lambda_M$)=1.4 and dm=0.775;
point E given by the coordinates, ($2\pi \cdot H/\lambda_M$)=1.2 and dm=0.68;
point F given by the coordinates, ($2\pi \cdot H/\lambda_M$)=1.0 and dm=0.792; and
point A;

in this order to provide a range ABCDEFA surrounded by six lengths of lines;

(c) structuring the SAW device so that ($2\pi \cdot H/\lambda_M$) and dm can fall within the range ABCDEFA including the surrounding six lengths of lines;

(d) producing the SAW device with the IDTs having a line width of 0.5 µm or more;

(e) utilizing the fifth harmonic in the 1st-order mode of the SAW excited by the IDTs; and (f) operating the SAW device at a frequency not less than 9.5 GHz and not more than 10.5 GHz.

4. A SAW device having a short-circuiting electrode laminated on a ZnO layer laminated on SAW-exciting IDTs placed on a thin dielectric film made of a diamond layer formed singly or formed on a substrate, the SAW device being characterized by the conditions of:

(a) providing a two-dimensional orthogonal-coordinate system, in which the axis of abscissa is represented by ($2\pi \cdot H/\lambda_M$) and the axis of ordinate is represented by dm, where H signifies the thickness of the ZnO layer, $\lambda_M$ signifies the wavelength of a harmonic of a SAW, and dm signifies the line width of the IDTs;

(b) in the orthogonal-coordinate system, connecting:
point A given by the coordinates, ($2\pi \cdot H/\lambda_M$)=0.8 and dm=0.900;
point B given by the coordinates, ($2\pi \cdot H/\lambda_M$)=1.0 and dm=0.910;
point C given by the coordinates, ($2\pi \cdot H/\lambda_M$)=1.5 and dm=0.853;
point D given by the coordinates, ($2\pi \cdot H/\lambda_M$)=2.0 and dm=0.682;
point E given by the coordinates, ($2\pi \cdot H/\lambda_M$)=2.5 and dm=0.589;
point F given by the coordinates, ($2\pi \cdot H/\lambda_M$)=3.0 and dm=0.527;
point G given by the coordinates, ($2\pi \cdot H/\lambda_M$)=3.2 and dm=0.500;
point H given by the coordinates, ($2\pi \cdot H/\lambda_M$)=1.6 and dm=0.500;
point I given by the coordinates, ($2\pi \cdot H/\lambda_M$)=1.5 and dm=0.523;
point J given by the coordinates, ($2\pi \cdot H/\lambda_M$)=1.0 and dm=0.715; and
point A;

in this order to provide a range ABCDEFGHIJA surrounded by 10 lengths of lines;

(c) structuring the SAW device so that ($2\pi \cdot H/\lambda_M$) and dm can fall within the range ABCDEFGHIJA including the surrounding 10 lengths of lines;

(d) producing the SAW device with the IDTs having a line width of 0.5 µm or more;

(e) utilizing the fifth harmonic in the 0th-order mode of the SAW excited by the IDTs; and (f) operating the SAW device at a frequency not less than 9.5 GHz and not more than 10.5 GHz.

5. A SAW device having a short-circuiting electrode laminated on a ZnO layer laminated on SAW-exciting IDTs placed on a thin dielectric film made of a diamond layer formed singly or formed on a substrate, the SAW device being characterized by the conditions of:

(a) providing a two-dimensional orthogonal-coordinate system, in which the axis of abscissa is represented by ($2\pi \cdot H/\lambda_M$) and the axis of ordinate is represented by dm, where H signifies the thickness of the ZnO layer, $\lambda_M$ signifies the wavelength of a harmonic of a SAW, and dm signifies the line width of the IDTs;

(b) in the orthogonal-coordinate system, connecting:
point A given by the coordinates, ($2\pi \cdot H/\lambda_M$)=0.5 and dm=1.60;
point B given by the coordinates, ($2\pi \cdot H/\lambda_M$)=1.0 and dm=1.15;
point C given by the coordinates, ($2\pi \cdot H/\lambda_M$)=1.4 and dm=0.675;
point D given by the coordinates, ($2\pi \cdot H/\lambda_M$)=1.0 and dm=0.703;
point E given by the coordinates, ($2\pi \cdot H/\lambda_M$)=0.5 and dm=1.16; and
point A;

in this order to provide a range ABCDEA surrounded by five lengths of lines;

(c) structuring the SAW device so that ($2\pi \cdot H/\lambda_M$) and dm can fall within the range ABCDEA including the surrounding five lengths of lines;

(d) producing the SAW device with the IDTs having a line width of 0.5 µm or more;

(e) utilizing the fifth harmonic in the 1st-order mode of the SAW excited by the IDTs; and (f) operating the SAW device at a frequency not less than 9.5 GHz and not more than 10.5 GHz.

6. A SAW device having SAW-exciting IDTs placed on a ZnO layer laminated on a short-circuiting electrode laminated on a thin dielectric film made of a diamond layer formed singly or formed on a substrate, the SAW device being characterized by the conditions of:

(a) providing a two-dimensional orthogonal-coordinate system, in which the axis of abscissa is represented by $(2\pi \cdot H/\lambda_M)$ and the axis of ordinate is represented by dm, where H signifies the thickness of the ZnO layer, $\lambda_M$ signifies the wavelength of a harmonic of a SAW, and dm signifies the line width of the IDTs;

(b) in the orthogonal-coordinate system, connecting:
point A given by the coordinates, $(2\pi \cdot H/\lambda_M)=1.0$ and dm=0.813;
point B given by the coordinates, $(2\pi \cdot H/\lambda_M)=1.5$ and dm=0.770;
point C given by the coordinates, $(2\pi \cdot H/\lambda_M)=1.7$ and dm=0.613;
point D given by the coordinates, $(2\pi \cdot H/\lambda_M)=1.5$ and dm=0.581; and
point A;
in this order to provide a range ABCDA surrounded by four lengths of lines;

(c) structuring the SAW device so that $(2\pi \cdot H/\lambda_M)$ and dm can fall within the range ABCDA including the surrounding four lengths of lines;

(d) producing the SAW device with the IDTs having a line width of 0.5 µm or more;

(e) utilizing the fifth harmonic in the 0th-order mode of the SAW excited by the IDTs; and (f) operating the SAW device at a frequency not less than 9.5 GHz and not more than 10.5 GHz.

7. A SAW device having SAW-exciting IDTs placed on a ZnO layer laminated on a short-circuiting electrode laminated on a thin dielectric film made of a diamond layer formed singly or formed on a substrate, the SAW device being characterized by the conditions of:

(a) providing a two-dimensional orthogonal-coordinate system, in which the axis of abscissa is represented by $(2\pi \cdot H/\lambda_M)$ and the axis of ordinate is represented by dm, where H signifies the thickness of the ZnO layer, $\lambda_M$ signifies the wavelength of a harmonic of a SAW, and dm signifies the line width of the IDTs;

(b) in the orthogonal-coordinate system, connecting:
point A given by the coordinates, $(2\pi \cdot H/\lambda_M)=1.0$ and dm=1.01;
point B given by the coordinates, $(2\pi \cdot H/\lambda_M)=2.0$ and dm=0.798;
point C given by the coordinates, $(2\pi \cdot H/\lambda_M)=3.0$ and dm=0.783;
point D given by the coordinates, $(2\pi \cdot H/\lambda_M)=4.0$ and dm=0.725;
point E given by the coordinates, $(2\pi \cdot H/\lambda_M)=5.0$ and dm=0.619;
point F given by the coordinates, $(2\pi \cdot H/\lambda_M)=5.2$ and dm=0.540;
point G given by the coordinates, $(2\pi \cdot H/\lambda_M)=5.0$ and dm=0.506;
point H given by the coordinates, $(2\pi \cdot H/\lambda_M)=4.0$ and dm=0.525;
point I given by the coordinates, $(2\pi \cdot H/\lambda_M)=3.0$ and dm=0.567;
point J given by the coordinates, $(2\pi \cdot H/\lambda_M)=2.0$ and dm=0.653;
point K given by the coordinates, $(2\pi \cdot H/\lambda_M)=1.0$ and dm=0.792; and
point A;
in this order to provide a range ABCDEFGHIJKA surrounded by 11 lengths of lines;

(c) structuring the SAW device so that $(2\pi \cdot H/\lambda_M)$ and dm can fall within the range ABCDEFGHIJKA including the surrounding 11 lengths of lines;

(d) producing the SAW device with the IDTs having a line width of 0.5 µm or more;

(e) utilizing the fifth harmonic in the 1st-order mode of the SAW excited by the IDTs; and (f) operating the SAW device at a frequency not less than 9.5 GHz and not more than 10.5 GHz.

8. A SAW device having a short-circuiting electrode laminated on a ZnO layer laminated on SAW-exciting IDTs placed on a thin dielectric film made of a diamond layer formed singly or formed on a substrate, the SAW device being characterized by the conditions of:

(a) providing a two-dimensional orthogonal-coordinate system, in which the axis of abscissa is represented by $(2\pi \cdot H/\lambda_M)$ and the axis of ordinate is represented by dm, where H signifies the thickness of the ZnO layer, $\lambda_M$ signifies the wavelength of a harmonic of a SAW, and dm signifies the line width of the IDTs;

(b) in the orthogonal-coordinate system, connecting:
point A given by the coordinates, $(2\pi \cdot H/\lambda_M)=0.50$ and dm=0.50;
point B given by the coordinates, $(2\pi \cdot H/\lambda_M)=0.50$ and dm=0.66;
point C given by the coordinates, $(2\pi \cdot H/\lambda_M)=0.80$ and dm=0.54;
point D given by the coordinates, $(2\pi \cdot H/\lambda_M)=0.90$ and dm=0.50; and
point A;
in this order to provide a range ABCDA surrounded by four lengths of lines;

(c) in the orthogonal-coordinate system, connecting:
point E given by the coordinates, $(2\pi \cdot H/\lambda_M)=0.50$ and dm=0.99;
point F given by the coordinates, $(2\pi \cdot H/\lambda_M)=0.50$ and dm=1.16;
point G given by the coordinates, $(2\pi \cdot H/\lambda_M)=0.90$ and dm=0.75;
point H given by the coordinates, $(2\pi \cdot H/\lambda_M)=0.80$ and dm=0.81; and
point E;
in this order to provide a range EFGHE surrounded by four lengths of lines;

(d) structuring the SAW device so that $(2\pi \cdot H/\lambda_M)$ and dm can fall within either of the range ABCDA including the surrounding four lengths of lines or the range EFGHE including the surrounding four lengths of lines;

(e) producing the SAW device with the IDTs having a line width of 0.5 µm or more;

(f) utilizing the third harmonic in the 1st-order mode of the SAW excited by the IDTs; and (g) operating the SAW device at a frequency not less than 9.5 GHz and not more than 10.5 GHz.

* * * * *